United States Patent

Kashioka et al.

[11] Patent Number: 5,617,033
[45] Date of Patent: Apr. 1, 1997

[54] METHOD AND APPARATUS FOR ELECTRICALLY TESTING MULTI-CORE CABLE

[75] Inventors: Tohru Kashioka; Shogo Tanno; Etsuro Mamishin, all of Hyogo-ken, Japan

[73] Assignee: Mitsubishi Cable Industries, Ltd., Hoygo-ken, Japan

[21] Appl. No.: 415,214

[22] Filed: Apr. 3, 1995

[30] Foreign Application Priority Data

Apr. 5, 1994 [JP] Japan .................................. 6-093140

[51] Int. Cl.$^6$ ........................................ G08B 21/00
[52] U.S. Cl. .................. 324/540; 324/539; 324/73.1; 324/66; 340/651
[58] Field of Search ........................ 324/540, 539, 324/541, 66, 73.1; 340/651, 650, 652

[56] References Cited

U.S. PATENT DOCUMENTS

| | | | |
|---|---|---|---|
| 3,217,244 | 11/1965 | Glover | 324/540 |
| 3,982,180 | 9/1976 | Vaiden | 324/540 |
| 4,158,167 | 6/1979 | Tanno | 324/539 |
| 4,160,947 | 7/1979 | Tanno et al. | |
| 4,399,400 | 8/1983 | Rockwell | 324/540 |
| 4,418,250 | 11/1983 | Hillingoss | 324/540 |
| 4,510,435 | 4/1985 | Tanno | 324/540 |
| 5,220,285 | 6/1993 | Cerda | 324/540 |
| 5,225,814 | 7/1993 | Choi . | |

FOREIGN PATENT DOCUMENTS

| | | |
|---|---|---|
| 2369572 | 5/1978 | France . |
| 57-32781 | 7/1982 | Japan . |
| 57-32784 | 7/1982 | Japan . |
| 57-51067 | 10/1982 | Japan . |

Primary Examiner—Kenneth A. Wieder
Assistant Examiner—Jose M. Solis
Attorney, Agent, or Firm—Sixbey Friedman Leedom & Ferguson; Gerald J. Ferguson, Jr.; Evan R. Smith

[57] ABSTRACT

A plurality of cores of a multi-core cable are collectively conducted at first ends side thereof and are isolated from one another at second ends side thereof. The cores are engaged at the first ends side with grooves formed on a movable member one by one so as to be picked up and are sequentially transported toward an electrode. The picked-up core is cut during :its transportation so as to be electrically separated from a collective conducting part at the first end side. A high voltage is charged to the picked-up core through the electrode and based on an electric conduction characteristic of its charging current a judgment is made about whether there is a defective contact (dielectric breakdown) between the picked-up core and other cores. Further, the electric charge of the picked-up core is discharged, the picked-up core is recharged, and based on electric conduction characteristics of these discharging current and charging current a confirmation that the above judgment was not a misjudgment is made. After the discharging, the movable member is moved again and then the next picked-up core is tested.

5 Claims, 5 Drawing Sheets

METHOD AND APPARATUS FOR ELECTRICALLY TESTING MULTI-CORE CABLE

BACKGROUND OF THE INVENTION

This invention relates to a method and apparatus for electrically testing a multi-core cable, and particularly relates to a method and apparatus for electrically testing whether there is a defective contact or dielectric breakdown between adjacent cores of the multi-core cable which has an enormous number of insulated cores and serves as a communication cable and the like.

Generally, as for such a multi-core cable, whether adjacent cores are in defective contact or dielectrically broken clown on application of a voltage must be inspected and tested, order to guarantee the quality of the cable, in the intermediate or final state of cable production. There have been conventionally known various kinds of electric testing methods and apparatus For the above inspection and test.

For example, Japanese Patent Application Publication Gazette No. 57-51067 discloses a method for electrically testing a multi-core cable, in which the following steps are carried out. That is, a group of plural cores in a multi-core cable are first collectively conducted at the near ends thereof while isolated From one another at the far ends thereof. In this state, the cores are picked up one by one out of the group of cores at the near ends and are transported one by one, and then the transported core is electrically separated from the collectively conducted part located at the near ends of the group off cores. Subsequently, while the core is transported, the core is made contact with an electrode so as to be electrically charged and then contact judgment is made about whether or not an insulation characteristic between the picked-up core and other cores is normal based on whether or not an electric conduction characteristic of a charging current between the charged core and the group of cores at the near ends is a specific electric conduction characteristic of a charging current. Further, while the core is transported, the electric charge applied to the core is discharged. Next, the discharged core is electrically charged again and then confirmation is made about whether or not the above contact judgment is correct based on whether or not electric conduction characteristics of discharging and charging currents between the picked-up core and the group of cores at the near ends are specific electric conduction characteristics of discharging and charging currents.

In this case, the picking-up of a core is made by engaging a single core with a groove provided on the outer periphery of a rotary disc. The transportation of the picked-up core is made by rotating the rotary disc with the single core engaged with the groove. Then, during the rotating operation of the rotary disc, there are performed the contact between the picked-up core and the electrode, the judgment based on the electric charging, and the confirmation of the judgment based on the discharging and the subsequent electric charging. In short, in the above electric testing method, inspection and test are performed in such a manner as to charge and discharge the core within the time period when the core during rotary movement is kept in contact with the electrode.

As mentioned above, in the above conventional electric testing method, the picked-up core is charged and discharged during its movement toward the electrode. However, if the electrode is worn, a contact of the core with the electrode may be reduced in time or lost so that a stable contact of the core with the electrode cannot be secured. In such a case, a predetermined amount of charging current cannot be applied to the core or no charging current cannot be applied thereto, so that the contact judgment may not be correctly made thereby resulting in a misjudgment or the judgment itself may be impossible. In particular, since the picked-up core comes into contact with the electrode while moved by the rotation of the rotary disc, a shock at the contact of the core with the electrode while moved invites vibration of the electrode, so that a continuous contact of the core with the electrode may not be secured. Such a disadvantage often generates in the case that the electrode is forced by a resilient member such as a spring.

Further, if insulation cover layers each of which covers a large number of cores forming the multi-core cable are different in thickness from one another or if the core is decentered in the insulation cover layer, a duration of contact between the core conductor and the electrode varies from core to core. In such a case, it may be impossible for some cores to be sufficiently electrically charged through the electrode.

In view off the forgoing problems, this invention has been made. An object of this invention is to effectively prevent an unstable inspection owing to a worn electrode thereby increasing the stability and accuracy of the inspection.

SUMMARY OF THE INVENTION

To attain the above object, this invention adopts a way of temporarily stopping transporting a picked-up core for a set time from a contact of the picked-up core with an electrode to a contact judgment on the contact via an electric charging to the picked-up core, or for a set time from a contact of the picked-up core with the electrode to a confirmation of a contact judgment on the contact via an electric charging, the contact judgment, a discharging of the electric charge of the picked-up core. That is, electric charging to the picked-up core and contact judgment are made in the state that the picked-up core is stopped in contact with the electrode. Alternatively, electric charging to the picked-up core, contact judgment, discharging of electric charge from the picked-up core and confirmation of the contact judgment are made in the state that the picked-up core is stopped in contact with the electrode.

Specifically, a method for electrically testing a multi-core cable according to a first invention comprises: a step of collectively conducting a plurality of cores of the multi-core cable at first ends side thereof while isolating them from one another at second ends side thereof; a transportation step of picking up the cores one by one at the first ends side to sequentially transport them toward an electrode; a step of cutting the picked-up core during transportation to electrically separate it from a collective conducting part at the first end side; a step of contacting a conductor of the picked-up core with the electrode and stopping the transportation of the picked-up core while keeping the picked-up core in contact with the electrode; a charging step of electrically charging the picked-up core of which transportation is stopped through the electrode from the first end side; a judgment step of judging, based on a current flowing through the picked-up core by electrically charging thereto in the charging step, whether or not an insulation characteristic between the picked-up core and other cores is normal; and a retransportation step of transporting again the picked-up core after the judgment.

Further, a method for electrically testing a multi-core cable according to a second invention comprises: a step of collectively conducting a plurality of cores of the multi-core cable at first ends side thereof while isolating them from one another at second ends side thereof; a transportation step of picking up the cores one by one so as to engage each of them at the first ends side with at least one groove formed on a rotary member one by one and rotating the rotary member to transport the picked-up cores one by one toward a blade electrode; a step of cutting the picked-up core during transportation by the rotation of the rotary member to electrically separate it from a collective conducting part at the first end side; a step of contacting the picked-up core with the blade electrode, slightly rotating the rotary member while keeping the picked-up core in contact with the blade electrode and then stopping the rotation of the rotary member; a charging step of electrically charging the picked-up core of which transportation by the rotation of the rotary member is stopped through the blade electrode from the cut first end side; a judgment step of judging, based on a current flowing through the picked-up core by electrically charging thereto in the charging step, whether or not an insulation characteristic between the picked-up core and other cores is normal; and a retransportation step of transporting again the picked-up core by rotating again the rotary member after the judgment.

Furthermore, to the first and second inventions, there may be preferably added, between the judgment step and the retransportation step, a discharging step of discharging the electric charge applied to the picked-up core and a confirmation step of confirming, based on an electric conduction characteristic of a discharging current in the discharging step, whether or not the judgment in the judgment step has been made correctly. More preferably, a recharging step of electrically charging again the discharged picked-up core may be added after the discharging step so that the confirmation step can be performed based on not only the electric conduction characteristic of a discharging current in the discharging step but also the electric conduction characteristic of a charging current in the recharging step. Moreover, it is preferable to repeat the charging step and the subsequent discharging step two times.

In the first and second inventions having the respective structures above-mentioned, when the picked-up core comes into contact with the electrode or slightly after the picked-up core comes into contact with the blade electrode, the transportation of the picked-up core is stopped and then the charging and judgment steps, or the charging, judgment, discharging, recharging and confirmation steps are performed with the transportation of the picked-up core stopped until the retransportation step. Thus, the picked-up core can be kept in stable and secure contact with the electrode or the blade electrode and there can be sufficiently obtained a duration of stable and secure contact of the picked-up core with the electrode or the blade electrode, that is, the period of time for performing the charging, judgment, discharging, recharging and confirmation steps. Consequently, in the judgment step, there can be securely carried out the judgment about whether or not an electric conduction characteristic of a charging current between the picked-up core and other cores is a specific electric conduction characteristic of a charging current, and there can be securely carried out the contact judgment about whether or not an insulation characteristic between the picked-up core and other cores is normal based on the judgment about the electric conduction characteristic. Further, in the confirmation step, there can be securely carried out the judgment about whether or not an electric conduction characteristic of a discharging current, or electric conduction characteristics of a discharging current and a charging current in the recharging step are specific characteristics, and there can be securely carried out the confirmation about whether or not the contact judgment in the judgment step is a misjudgment due to defective contact or non-contact between the picked-up core and the electrode or the blade electrode based on the judgment mentioned above.

Thus, according to the first and second inventions, there can be effectively prevented unperformed inspection (unperformed test) and misjudgment due to defective contact between the picked-up core and the electrode, which is easy to occur in the case of electrically charging the picked-up core through the worn electrode while transporting it along the worn electrode in the conventional electric testing method, and there can be effectively prevented unstable inspection due to abrasion of the electrode. Accordingly, there can be securely performed inspection and test about whether or not the cores of the multi-core cable are in defective contact with one another. Particularly, there can be securely prevented defective contact between the picked-up core and the electrode due to shock during rotary movement of the picked-up core, which is easy to occur in the case of contacting the picked-up core with the electrode while keeping the rotary movement of the picked-up core in the conventional electric testing method. Further, even if variations in thickness between insulation cover layers of the cores or eccentricity of the core inside the insulation cover occur, a duration of contact between the electrode and the core conductor can be equal with respect to all the cores, thereby sufficiently stably charging the picked-up core with electricity through the electrode.

Furthermore, even if the electrode is worn, the electrode can be sufficiently used so that inspection and test can be performed over a long term. In addition, since the degree of abrasion (abrasion state) of the electrode can be diagnosed, the position of the electrode can be properly adjusted and the time for replacing the electrode with new one can be appropriately judged.

Moreover, since the picked-up cores sequentially come into contact with the electrode one by one at regular time intervals and each picked-up core is inspected remaining in contact with the electrode, the core having reached the electrode at an irregular time interval can be detected, thereby preventing such a core from passing without inspected.

Meanwhile, a third invention premises an apparatus for electrically testing a defective contact between adjacent cores of a multi-core cable having a plurality of cores which are each covered with an insulation cover layer, are collectively conducted at first ends side thereof to a collective conducting part and are isolated from one another at second ends side thereof.

In addition, the electric testing apparatus comprises: a movable member having at least one groove, on the surface thereof, with which the cores on the first ends side are engageable one by one, the movable member relatively moving with respect to the collectively conducted cores so as to pick up them by sequentially engaging them with the groove one by one; electric separating means for electrically separating, from the collective conducting part, the picked-up core engaging with the groove of the movable member; an electrode provided along a path on which the movable member moves, the electrode being contactable with a conductor of the electrically separated picked-up core; an intermittent operating motor which intermittently operates for moving the movable member to contact the picked-up core which has been electrically separated by the electric separating means with the electrode, stopping the movement of the movable member for a set time while keeping the picked-up core in contact with the electrode, and then moving the movable member again; and a charging circuit part for electrically charging the picked-up core through the electrode within the set time when the movable member is stopped, the charging circuit part being connected to the electrode.

Preferably, the third invention further comprises a discharging circuit part for discharging the electric charge applied to the picked-up core by the charging circuit part, the discharging circuit part being connected to the electrode.

Further, in the third invention, it is preferable to use as the movable member a disc-shaped rotary member, as the electric separating means a cutter for electrically separating the picked-up core from the collective conducting part by cutting the picked-up core, as the electrode a blade electrode capable of cutting the insulation cover layer of the core, and as the intermittent operating motor a pulse motor.

Under the above structure of the third invention, the movable member is securely stopped by the intermittent operating motor, so that the picked-up core which has been picked up and transported by the movable member is kept in contact with the electrode with securely stopped for a set time. Then, the stopped picked-up core is electrically charged through the electrode by the charging circuit part and thereafter the electric charge applied to the picked-up core is discharged by the discharging circuit part.

Consequently, according to the electric testing apparatus of the third invention, the electric testing methods of the first and second inventions can be securely performed, thereby securely obtaining the effects of the first and second inventions. At this time, if the disc-shaped rotary member is used as the movable member, an apparatus for sequentially transporting a plurality of cores and inspecting them can be compacted. If the cutter For cutting the picked-up core is used as electric separating means, the picked-up core can be securely electrically separated. If the blade electrode is used as the electrode, the blade electrode is cut into the insulation cover layer of the core so that the conductor of the core can be securely made contact with the blade electrode. If the pulse motor is used as the intermittent operating motor, the movement off the movable member is stopped at precise regular time intervals so that the picked-up core and the electrode can be securely kept in contact with each other, and the movable member can be moved again after the tests such as a contact judgment.

DESCRIPTION OF THE PREFERRED EMBODIMENTS

Detailed description is made below about embodiments of this invention with reference to the drawings.

Figure 1:
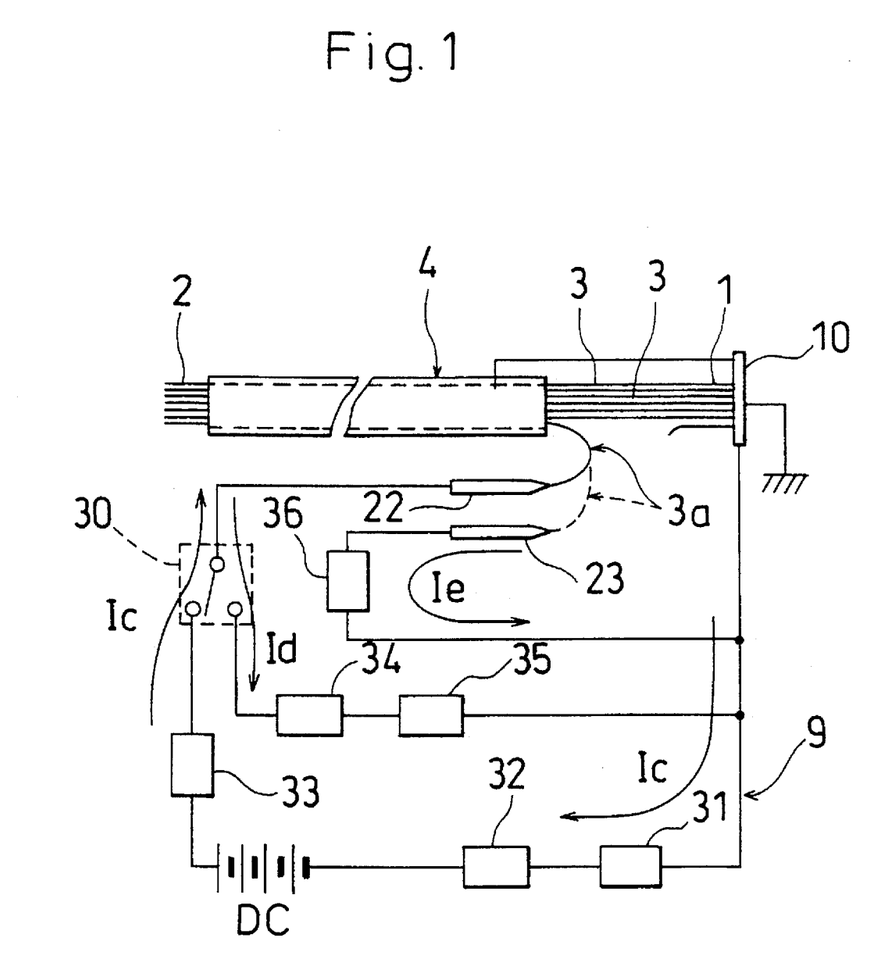
FIG. 1 is a diagram schematically showing the structure of an embodiment of an apparatus for electrically testing a multi-core cable according to this invention.

FIG. 1 shows a schematic diagram of the whole structure of an apparatus for electrically testing a multi-core cable according to this invention. The electric testing apparatus is For inspecting a defective contact between adjacent cores in a multi-core cable 4. The multi-core cable 4 has a plurality of cores 3, 3, . . . each covered with an insulation cover layer. The plural cores 3, 3, . . . are collectively conducted at first ends 1 thereof and are mutually isolated at second ends 2 thereof.

As shown in FIGS. 1, 3, 4 and 5, the electric testing apparatus comprises: a disc-shaped rotary member 6 as a movable member which is disposed at the first ends 1 side of the plural cores 3, 3, . . . and which has grooves 5, on the outer periphery thereof, with which the cores 3 are engageable one by one; an intermittent operating motor 7 for rotating the rotary member 6 at regular time intervals; a cutter 8 as electric separating means for cutting a picked-up core 3a engaged with the groove 5 of the rotary member 6: and a charging-discharging circuit part 9 as a charging circuit part and a discharging circuit part for electrically charging the picked-up core 3a and then discharging the electric charge of the picked-up core 3a. As shown in FIG. 1, the core 3, 3, . . . of the multi-core cable 4 are collectively conducted at the first ends 1 side by a common electrode 10 as a collective conducting part and are connected to the ground, except for each insulation cover layer of the cores 3.

The intermittent operating motor 7 is composed of, for example, a pulse motor and is held by a block 12 fixed on a support plate 11.

Figure 3:
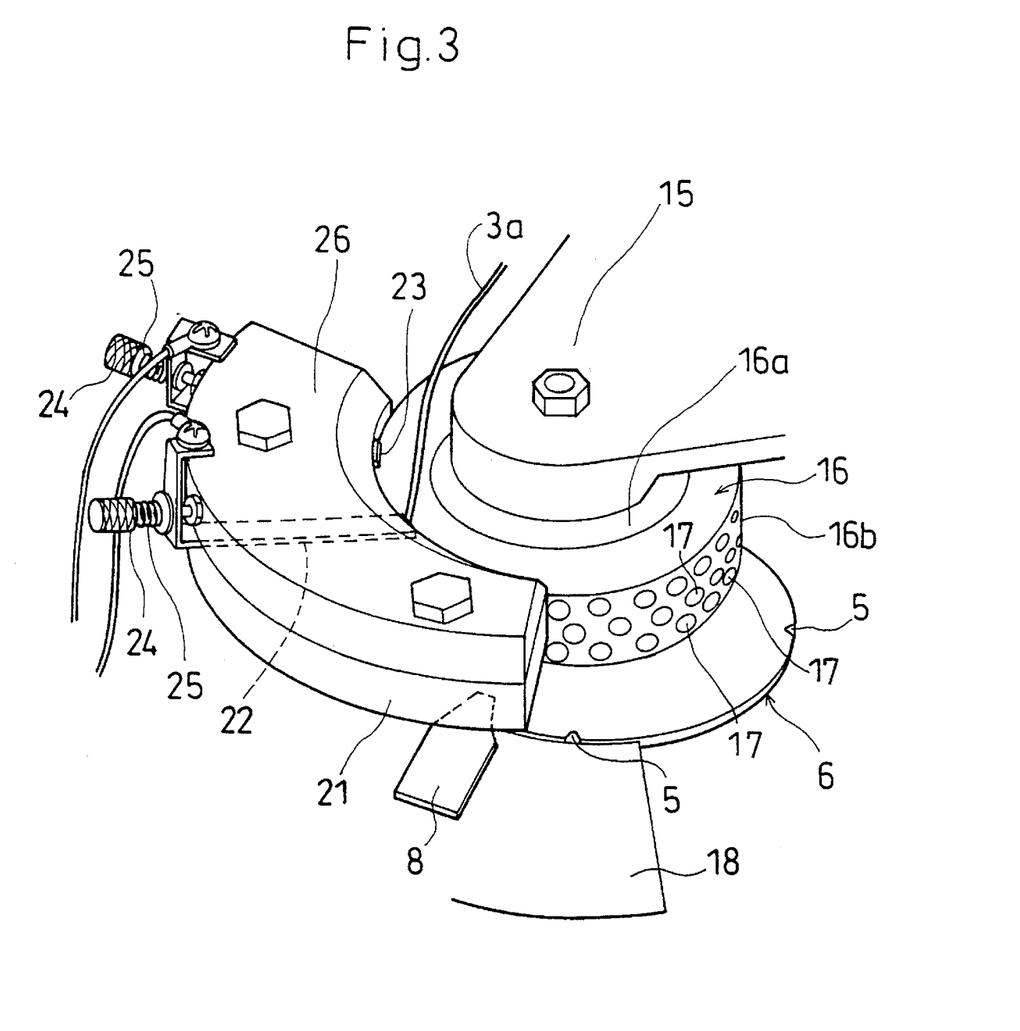
FIG. 3 is a perspective view of main portion of an apparatus for electrically testing a multi-core cable.
Figure 4:
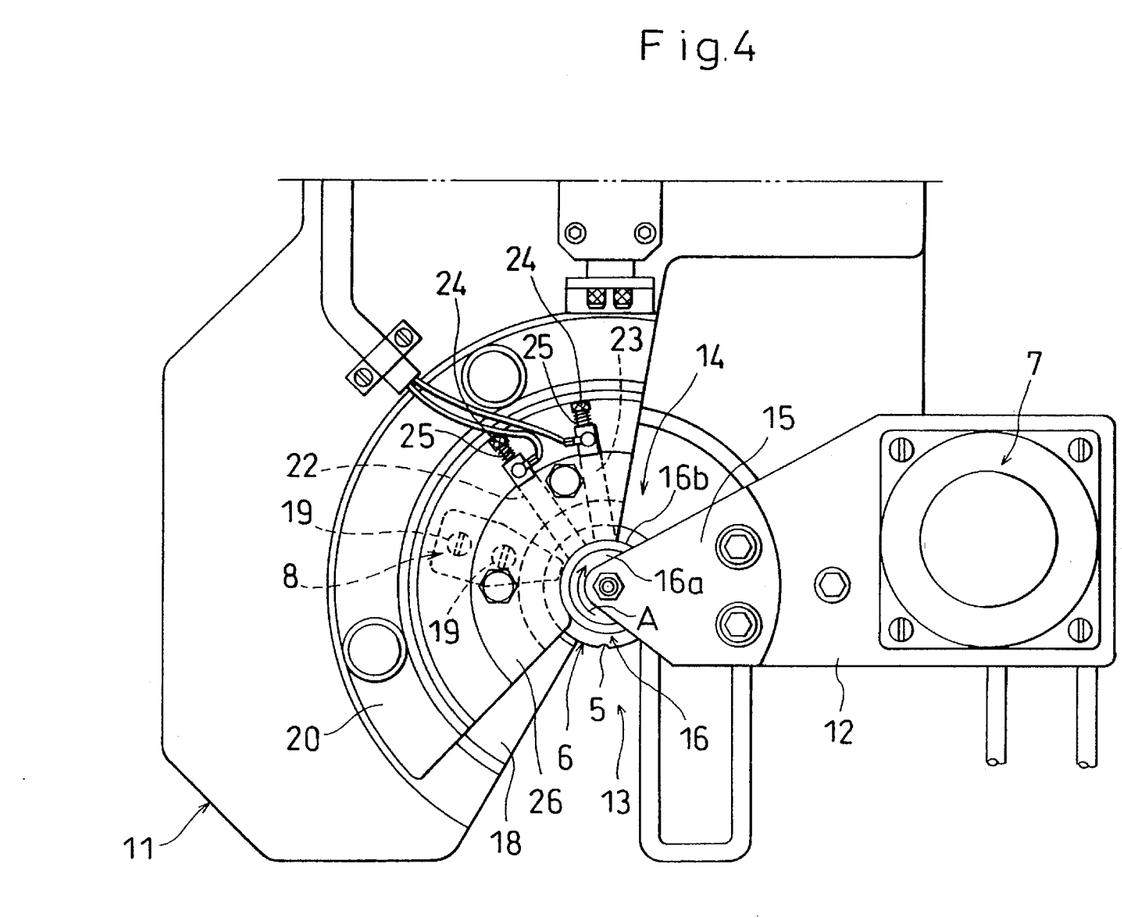
FIG. 4 is a plan view of main portion of the apparatus for electrically testing a multi-core cable.

On the block 12, a block plate 15 is fixed so as to define a core entry opening 13 and a core discharge opening 14 (see FIG. 4). At one end of the block plate 15, a rotor 16 is pivoted. As shown in FIGS. 3 and 4, the rotor 16 is composed of a disc-shaped body part 16a and an outer ring part 16b which is engaged with the outer periphery of the body part 16a and which is formed of rubber or synthetic resin. A large number of projection parts 17, 17, . . . are provided on the outer periphery of the outer ring part 16b.

The rotor 16 and the intermittent operating motor 7 are connected so as to be interlocked with each other by an interlock mechanism M which comprises a pulley and a belt wound around the pulley. The rotor 16 is driven by the intermittent operating motor 7 to rotate.

Meanwhile, the rotary member 6 is fixed under the rotor 16. The rotary member 6 is integrally rotated with the rotor 16 according to its rotation. Thus, the rotation of the intermittent operating motor 7 rotates the rotor 16 and the rotary member 6.

As mentioned above, a plurality of grooves 5, for example, four grooves, are formed on the outer periphery of the rotary member 6. Each of the grooves 5 may have a size capable of picking up a single core 3. That is, the rotary member 6 may be so composed that a plurality of cores 3, 3, . . . are made contact under pressure with the outer periphery of the rotary member 6 and the cores 3 are separately engaged with the grooves 5 so as to be picked up one by one by the rotation off the rotary member 6 as shown in an arrow A of FIG. 4.

Figure 5:
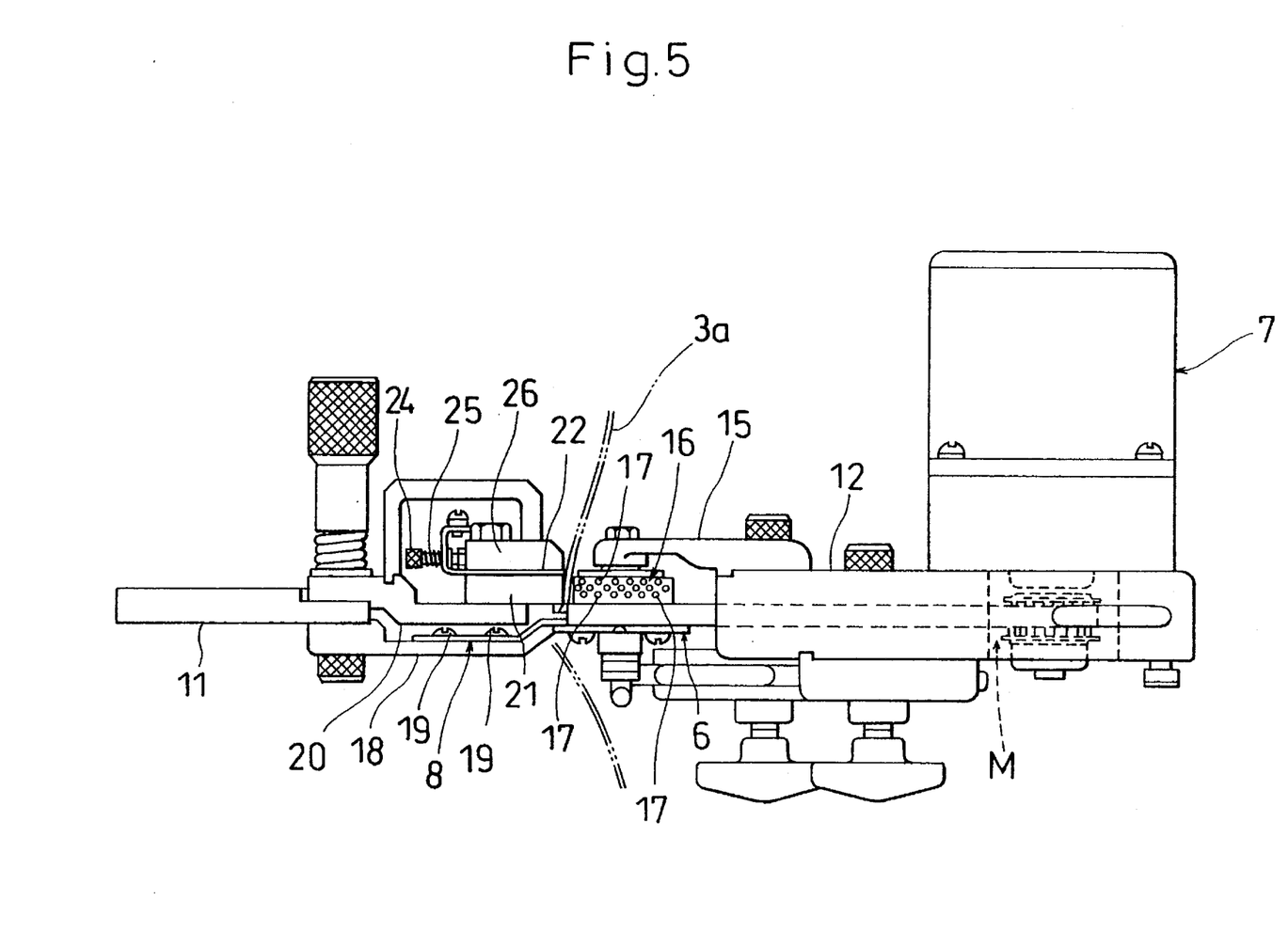
FIG. 5 is a side view of main portion of the apparatus for electrically testing a multi-core cable.

As shown in FIGS. 4 and 5, the support plate 11 is provided with a block piece 18 whose edge is close to the outer periphery of the rotary member 6 with a small space left therebetween. The above-mentioned cutter 8 is attached to the block piece 18. The cutter 8 is for cutting, at its attached position, the core 3 picked up by the rotary member 6 to electrically separate the picked-up core 3 from the common electrode 10. A projection amount of the edge of the cutter 8 is changeable by adjusting the positions of position adjusting screws 19, 19.

The upper surface of the cutter 8 is covered with an insulating cover 20 attached to the upper part of the support plate 11. A step-like clearance is formed in the vicinity of the edge of the insulating cover 20. Accordingly, the picked-up core 3a cut by the cutter 8 is movable with the cut end thereof dielectrically confined in the clearance.

Further, a plate 21 is provided on the insulating cover 20 and a pair of electrodes 22, 23 are provided on the plate 21. One electrode 22 of the pair has a function as a picking-up detecting electrode for electrically charging the picked-up core 3a and confirming whether or not a single core 3a has been picked up, a function as a measuring electrode for inspecting whether or not there is a defective contact between the cores and a function of discharging the electric charge from the core 3a and confirming whether or not the core 3a has been inspected. The other electrode 28 is for safety assurance and for finally completely discharging the whole electric charge from the core 3a.

Each of the electrodes 22, 23 is composed of a blade electrode capable of cutting the insulation cover layer of the core 3, and is provided so as to have a slight clearance between its edge and the outer periphery of the rotor 16. The shaft members 24, 24 are connected to the electrodes 22, 23, respectively. Elastic members 25, 25 are provided around the outer peripheries of the shaft members 24, 24, respectively to elastically thrust respective electrodes 22, 23.

There is provided on the plate 21 a cover 26 for covering the electrodes 22, 23.

Next, description is made about the charging-discharging circuit part 9.

As shown in FIG. 1, the charging-discharging circuit part 9 comprises the above-mentioned electrodes 22, 23 and a charge/discharge change switch 30, forms a charging circuit C1 composed of a path of positive side of electric source DC, resistor 33, charge/discharge change switch 30, electrode 22, picked-up core 3a, common electrode 10, resistor 31, resistor 32 and negative side of electric source DC, and forms a discharging circuit C2 composed of a path of picked-up core 3a, electrode 22, charge/discharge change switch 30, resistor 34, resistor 35 and common electrode 10.

Further, the charging-discharging circuit part 9 also Forms a discharging circuit C3 composed of a path of picked-up core 3a, electrode 23, resistor 36 and common electrode 10.

Next, description is made about a method for testing a multi-core cable with the use of the apparatus constructed as mentioned above for electrically testing the multi-core cable 4.

First, as shown in FIG. 1, a plurality of cores 3, 3, . . . of the multi-core cable 4 are collectively conducted at first ends 1 side thereof through the common electrode 10 and are isolated from one another at second ends 2 side thereof. Then, the plural cores 3, 3, . . . are positioned so as to come into contact, at the first ends 1 side, with the outer periphery of the rotary member 6 under pressure, and the rotary member 6 is intermittently rotated by the rotation of the intermittent operating motor 7.

By the rotation of the rotary member 6, a single core 3 is engaged with the groove 5 of the rotary member 6 to become a picked-up core 3a. The picked-up core 3a is guided from the core entry opening 13 to the rotor 16 to enter between the plate 21 and the cover 26, and then reaches the position of the cutter 8 to be cut by the cutter 8. Thus, the picked-up core 3a is electrically separated from the common electrode 10.

The rotation of the rotary member 6 is continued after the picked-up core 3a is cut. When the cut picked-up core 3a reaches the electrode 22, the edge of the electrode 22 cuts into the insulation cover layer of the picked-up core 3a so that the electrode 22 comes into contact with the conductor the picked-up core 3a.

After the conductor of the picked-up core 3a comes into contact with the electrode 22, the rotary member 6 Further rotates slightly within the width of the edge of the electrode 22 until the contact between the electrode 22 and the conductor of the picked-up core 3a is secured. At this stage, the intermittent operating motor 7 is deactivated to stop the rotation of the rotary member 6.

At this time, since the movable piece of the charge/discharge change switch 30 is kept in contact with a charge-side contact so as to give the electrode 22 a DC voltage, a high voltage is applied to the picked-up core 3a through the electrode 22. An electrostatic capacitance is Formed between the picked-up core 3a and other adjacent cores 3, 3, . . . through the insulation cover layers thereof over the whole length of the multi-core cable. In such a state, a high voltage is applied to the picked-up core 3a through the electrode 22. As a result, a charging current Ic as shown in FIG. 2 flows through the charging circuit C1.

In this case, if there is no defective contact between the picked-up core 3a and other cores 3, that is, if the picked-up core 3a occurs no dielectric breakdown, the charging current Ic rapidly reaches a peak value and are then saturated to be small, as shown in a curve a.

Figure 2:
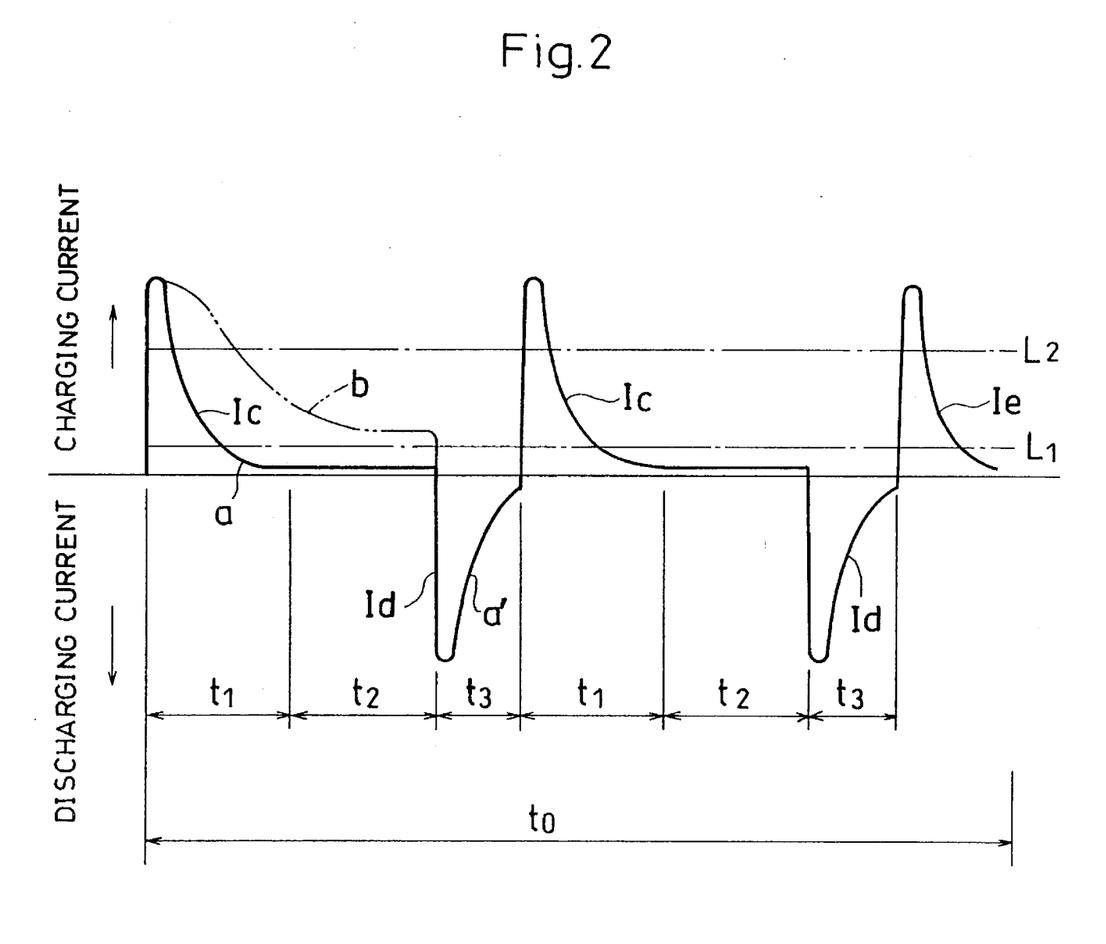
FIG. 2 is a current form chart showing principles of judgments in this invention.

Next, when the movable piece of the charge/discharge change switch 30 is changed to a discharge-side contact and is kept in this state, a discharging current Id as shown in FIG. 2 flows through the discharging circuit C2. In this case, if there is no defective contact between the picked-up core 3a and other cores 3, the discharging current Id decays with the almost same time constant as in the charging current Ic, as shown in a curve a'.

Thereafter, the movable piece of the charge/discharge change switch 30 is changed again to the charge-side contact and is kept in this state so that a charging current Ic flows through the charging circuit C1 again. Then, the movable piece of the charge/discharge change switch 30 is changed again to the discharge-side contact and is kept in this state so that a discharging current Id flows through the discharging circuit C2 again.

Meanwhile, in the multi-core cable 4, each electrostatic capacitance between the plural cores 3, 3, . . . becomes a substantially constant value depending upon the cable length and has substantially no relation with the core type or the core size. Therefore, the time t1 of FIG. 2 is selected to a time that even if the electrostatic capacitance depending upon the cable length varies to a considerably large extent, it can be sufficiently saturated at a constant high voltage. In other words, when the time t1 has passed since the application of voltage started, a charging current Ic which flows into the picked-up core 3a through the electrode 22 is saturated to the extent that it does not substantially flow. The time t2 is for inspection and its period depends upon inspection precision.

In FIG. 2, L1 is a defective contact judgment level and becomes larger than a charging current Ic shown in the curve a if there is no defective contact between the cores. In the case of defective contact, however, since the charging current Ic is decreased in its insulation resistance and a part of the current directly flows into the ground, the charging current Ic is gradually saturated. As a result, the value of the charging current Ic becomes a curve b which exceeds the contact judgment level L1 at all instants of time. This enables confirmation of a defective contact state between the cores.

Next, when the time t2 has passed, a high voltage applied to the electrode 22 is cut off and the charge/discharge change switch 30 is changed to the discharging circuit C2 side. The time t3 is a period during which the switch 30 is maintained in the discharging circuit C2 side.

Meanwhile, if the electrode 22 is considerably worn so as not to come into contact with the picked-up core 3a, no voltage is applied to the picked-up core 3a so that no charging current flows therethrough. In such a case, there may be made a judgment that there is no defective contact between the cores. In this case, however, even if the charge/discharge change switch 30 is change to the discharge side, the discharging circuit C2 is not formed and even if the charge/discharge change switch 30 is changed to the charge side, no charging current Ic flows. Accordingly, based on such conditions, there can be confirmed that the above non-contact judgment is a misjudgment resulting from that the electrode 22 and the picked-up core 3a do not contact.

Therefore, in this embodiment, after a charging step of letting flow the charging current Ic into the picked-up core 3a and a discharging step of letting flow the discharging current Id into the charged picked-up core 3a are repeated two times, the picked-up core 3a is electrically recharged in order that a charging current Ie Flows therethrough by the same amount as an electric charge having been discharged at the second time, as shown in FIG. 2. Thus, in the second charging and discharging steps, there can be securely performed a judgment about whether or not there is a defective contact and a confirmation about whether or not the contact judgment is correct.

In FIG. 2, L2 is a level for judging about whether or not a single core 3a has been picked up.

The time t0 is a period for which the second charging and discharging steps and the recharging step for letting flow the charging current Ie into the picked-up core 3a are performed. During the time t0, the rotary member 6 stops its rotation.

After the time t0 has passed, the intermittent operation motor 7 is activated again so that the rotary member 6 is rotated to transport the picked-up core 3a to the electrode 23. Then, the picked-up core 3a is made contact with the electrode 23 to form a discharging circuit C3, so that the electric charge applied to the core 3a is completely discharged. Thus, the electric charge which has been applied to the picked-up core 3a through the electrode 22 can be discharged thereby securing safety.

When the inspection of one picked-up core 3a is completed in the same manner as mentioned above, the next picked-up core 3a entering the next groove 5 of the rotary member 6 is cut by the cutter 8, is stopped with kept in contact with the electrode 22 and is then inspected. Thus, a plurality of cores 3, 3, . . . of the multi-core cable 4 are sequentially inspected one by one.

As described above, according to the above embodiment, there can be measured a time period that the core 3a comes into contact with the electrode 22, so that an abrasion state of the electrode 22 can be diagnosed. Further, there can be precisely recognized a time period that the core 3a comes into contact with the electrode 22, so that a non-inspection time period to a start of charging for inspecting the next core can be reduced.

In the above embodiment, a pulse motor is used as an intermittent operating motor for rotating the rotary member 6. Instead of the pulse motor, any kind of motor may be used if it can stop the rotation of the rotary member 6 with the core 3a remaining in contact with the electrode 22, for a set time, i.e., by the time t0, and then if it can rotate again the rotary member 6. For example, a servomotor or a ultrasonic motor may be used.

Furthermore, in the above embodiment, the number of grooves 5 provided with the rotary member 6 is four. However, the number of the grooves is arbitrarily changeable.

We claim:

1. An apparatus for electrically testing a multi-core cable having a plurality of cores which are each covered with an insulation cover layer, are collectively conducted at first ends thereof to a collective conducting part and are isolated from one another at second ends thereof, said apparatus comprising:

a disc-shaped rotary member having at an outer periphery thereof at least one groove with which the cores of the first ends are engageable one by one, the disc-shaped rotary member relatively rotating and moving with respect to the collectively conducted cores so as to pick up them by sequentially engaging them with the groove one by one;

electric separating means for electrically separating, from the collective conducting part, the picked-up core engaging with the groove of the disc-shaped rotary member;

a blade electrode provided along a path on which the disc-shaped rotary member moves, said blade electrode being capable of cutting the insulation cover layer of the electrically separated picked-up core and being contactable with a conductor of the electrically separated picked-up core by being elastically thrusted toward the disc-shaped rotary member;

an intermittent operating motor which intermittently operates for rotating and moving the disc-shaped rotary member to contact the picked-up core which has been electrically separated by the electric separating means with the blade electrode, stopping the rotation and movement of the disc-shaped rotary member for a set time while keeping the picked-up core in contact with the blade electrode, and then rotating and moving the disc-shaped rotary member again;

a charging circuit part for electrically charging the picked-up core through the blade electrode within the set time when the disc-shaped rotary member is stopped, said charging circuit part being connected to the blade electrode; and a discharging circuit part for discharging the electric charge applied to the picked-up core by the charging circuit part with the set time when the disc-shaped rotary member is stopped, said discharging circuit part being connected to the blade electrode.

2. A method for electrically testing a multi-core cable, said method comprising the steps of:

collectively conducting a plurality of cores of the multi-core cable at first ends thereof while isolating them from one another at second ends thereof;

picking up the cores one by one so as to engage each of them at the first ends with at least one groove formed on a rotary member, one by one, and rotating the rotary member to transport the picked-up cores one by one toward a blade electrode elastically thrusted toward the rotary member;

cutting the picked-up core during transportation by the rotation of the rotary member to electrically separate it from a collective conducting part at the first end;

electrically contacting the picked-up core with a blade electrode, slightly rotating the rotary member while keeping the picked-up core in contact with the blade electrode, and then stopping the rotation of the rotary member;

electrically charging the picked-up core through the blade electrode from the cut first end;

judging, based on a current flowing through the picked-up core by the charging thereto, whether or not an insulation characteristic between the picked-up core and other cores is normal;

discharging the electric charge applied to the picked-up core;

electrically charging again the discharged picked-up core;

confirming, based on electric conduction characteristics of a discharging current in the discharging step and of a charging current in the recharging step, whether or not the judgment in the judgment step has been made correctly; and transporting again the picked-up core by rotating again the rotary member after the confirmation step.

3. A method for electrically testing a multi-core cable according to claim 2, wherein the charging step and the subsequent discharging step are repeated two times.

4. An apparatus for electrically testing a multi-core cable according to claim 1 wherein the electric separating means is a citter for electrically separating the picked-up cord from the collective conducting part by cutting the picked-up core.

5. An apparatus for electrically testing a multi-core cable according to claim 1, wherein the intermittent operating motor is a pulse motor.

* * * * *